United States Patent
Feng et al.

(10) Patent No.: US 7,450,161 B1
(45) Date of Patent: Nov. 11, 2008

(54) SYSTEM AND METHOD TO ENHANCE THE UNIFORMITY OF INTENSITY DISTRIBUTION ON DIGITAL IMAGING SENSORS

(75) Inventors: Chen Feng, Bothell, WA (US); Jim Li, San Jose, CA (US)

(73) Assignee: MagnaChip Semiconductor Ltd., Cheongju-si (KR)

( * ) Notice: Subject to any disclaimer, the term of this patent is extended or adjusted under 35 U.S.C. 154(b) by 581 days.

(21) Appl. No.: 11/003,824

(22) Filed: Dec. 2, 2004

(51) Int. Cl.
    *H04N 9/73* (2006.01)
(52) U.S. Cl. .............. 348/224.1; 348/223.1; 348/227.1; 348/230.1; 250/208.1; 250/216
(58) Field of Classification Search ................. 348/224, 348/224.1, 223.1, 227.1, 230.1; 250/208.1, 250/216
    See application file for complete search history.

(56) References Cited

U.S. PATENT DOCUMENTS

| | | | |
|---|---|---|---|
| 4,739,394 A * | 4/1988 | Oda et al. ................. | 348/228.1 |
| 5,142,357 A | 8/1992 | Lipton et al. | |
| 5,323,052 A | 6/1994 | Koyama | |
| 5,324,930 A | 6/1994 | Jech, Jr. | |
| 5,422,285 A | 6/1995 | Ishibe | |
| 5,659,357 A * | 8/1997 | Miyano ................. | 348/223.1 |
| 5,798,847 A * | 8/1998 | Aerts ..................... | 358/464 |
| 5,838,023 A | 11/1998 | Goel et al. | |
| 6,008,511 A | 12/1999 | Tokumitsu et al. | |
| 6,246,043 B1 | 6/2001 | Merrill | |
| 6,274,917 B1 | 8/2001 | Fan et al. | |
| 6,411,331 B1 * | 6/2002 | Sansom-Wai et al. .... | 348/223.1 |
| 6,437,307 B1 | 8/2002 | Bloss | |
| 6,747,808 B2 | 6/2004 | Voss et al. | |
| 6,781,632 B1 | 8/2004 | Ide | |
| 6,838,715 B1 | 1/2005 | Bencuya et al. | |
| 6,884,985 B2 | 4/2005 | Raynor | |
| 6,903,391 B2 | 6/2005 | Takeuchi et al. | |
| 6,995,800 B2 | 2/2006 | Takahashi et al. | |
| 7,006,135 B2 * | 2/2006 | Ishimaru et al. .......... | 348/223.1 |
| 7,019,279 B2 | 3/2006 | Oda et al. | |
| 7,049,168 B2 | 5/2006 | Findlater et al. | |
| 7,161,129 B2 | 1/2007 | Galambos et al. | |

(Continued)

FOREIGN PATENT DOCUMENTS

WO    WO 2004/027875    4/2004

OTHER PUBLICATIONS

Office Action issued in U.S. Appl. No. 11/314,452, mailed Jun. 30, 2006.

(Continued)

*Primary Examiner*—David Ometz
*Assistant Examiner*—Quang V Le
(74) *Attorney, Agent, or Firm*—DLA Piper US LLP

(57) ABSTRACT

Systems, computer readable media and methods for digital processing of images captured by a sensor to enhance intensity uniformity of the images. The sensor captures an image of a white light source. Then, using the captured image, a compensation factor for each pixel of the image sensor is calculated and stored in a memory. Next, an actual image is captured by the image sensor. Subsequently, the signal intensity of each pixel is modified using the corresponding compensation factor to enhance the uniformity of the actual image.

17 Claims, 13 Drawing Sheets

U.S. PATENT DOCUMENTS

| | | | |
|---|---|---|---|
| 7,236,190 B2 * | 6/2007 | Yanof et al. | 348/222.1 |
| 2001/0036305 A1 * | 11/2001 | Jun | 382/149 |
| 2001/0056337 A1 | 12/2001 | Kurita | |
| 2003/0006363 A1 | 1/2003 | Campbell et al. | |
| 2003/0011686 A1 * | 1/2003 | Higuchi | 348/223.1 |
| 2003/0071271 A1 | 4/2003 | Suzuki et al. | |
| 2003/0173599 A1 | 9/2003 | Nakai | |
| 2004/0135899 A1 * | 7/2004 | Suemoto | 348/223.1 |
| 2004/0140564 A1 | 7/2004 | Lee et al. | |
| 2004/0165097 A1 | 8/2004 | Drowley et al. | |
| 2005/0010621 A1 * | 1/2005 | Pinto et al. | 708/200 |
| 2005/0061951 A1 | 3/2005 | Campbell et al. | |
| 2005/0122408 A1 * | 6/2005 | Park et al. | 348/223.1 |
| 2005/0174473 A1 * | 8/2005 | Morgan et al. | 348/370 |
| 2006/0006438 A1 | 1/2006 | Maruyama | |

OTHER PUBLICATIONS

Office Action issued in U.S. Appl. No. 11/314,452, mailed Jan. 5, 2007.

Office Action issued in U.S. Appl. No. 11/314,452, mailed Aug. 9, 2007.

Office Action issued in U.S. Appl. No. 11/314,452, mailed Mar. 17, 2008.

Office Action issued in U.S. Appl. No. 11/044,376, mailed Mar. 25, 2008.

Office Action issued in U.S. Appl. No. 11/044,376, mailed Mar. 13, 2006.

Office Action issued in U.S. Appl. No. 11/044,376, mailed Jan. 19, 2007.

Office Action issued in U.S. Appl. No. 11/004,465, mailed Mar. 28, 2006.

Office Action issued in U.S. Appl. No. 11/004,465, mailed Aug. 28, 2006.

Office Action issued in U.S. Appl. No. 11/004,465, mailed Jan. 25, 2007.

Office Action issued in U.S. Appl. No. 11/004,465, mailed Jan. 11, 2008.

Office Action issued in U.S. Appl. No. 11/004,465, mailed Jun. 2, 2008.

Office Action issued in U.S. Appl. No. 10/976,693, mailed Oct. 18, 2007.

Nikon, AF Micro-Nikkor 60mm f/2.8D 1993, Release: http://nikonimaging.com/global/products/lens/af/micro/af_micro60mmf_28d/index.htm.

Office Action issued in U.S. Appl. No. 10/976,693, mailed Jun. 11, 2008.

* cited by examiner

SYSTEM AND METHOD TO ENHANCE THE UNIFORMITY OF INTENSITY DISTRIBUTION ON DIGITAL IMAGING SENSORS

BACKGROUND

1. Field of the Invention

Invention relates to CMOS image sensor design and more particularly to enhancement of image uniformity of CMOS image sensors.

2. Background of the Related Art

There has been an increase of digital image devices using CMOS image sensors. Typically, a CMOS image sensor may be a sensor die that is a piece of silicon and includes an integrated circuit (IC) to function as an image sensor. A conventional sensor die comprises a processing area and a sensing area that may have from several hundred thousands to millions of identical sensor pixels. Hereinafter, for simplicity, the sensor die (or, equivalently CMOS image sensor) refers to its sensing area only.

In general, CMOS image sensor manufacturers test the intensity distribution of the sensor die using a uniform parallel light source. In this case, each pixel collects the uniform amount of optical signal at a fixed angle. Thus, defective pixel can be identified by comparing the output signal from each pixel with those from its neighboring pixels as the defective pixel would generate an unusual output signal.

However, a conventional image device with healthy pixels still can yield non-uniform images, which may be rooted in other sources, such as imaging lens. A conventional image sensor device has an imaging lens that forms an image to the sensor device in which pixels collect optical signals at different ray acceptance angles. Consequently, if the pixel layout is configured to have angular dependency on the ray acceptance angle, the output from pixels can be non-uniform and a function of the ray acceptance angle. Such non-uniformity may yield the non-uniform intensity pattern of the image even though the sensor die comprises healthy pixels.

One solution to improve uniformity might be designing pixel layout to minimize and/or remove angular dependency. However, such design requires lengthy and expensive turnaround processes. Thus, there is a need for image sensors with a system and method to enhance the uniformity by compensating intensity of digital images captured by the image sensors.

SUMMARY

The present invention provides image sensor devices with digital processing capability to enhance the uniformity of intensity distribution on images captured by the image sensors.

In one aspect of the present invention, a method for digital processing of an image captured by a sensor to enhance intensity uniformity of the image includes the steps of: capturing an image of a white light source using an image sensor; calculating a compensation factor for each pixel of the image sensor using the image; storing the compensation factor in a memory; capturing an actual image using the image sensor; and processing a signal intensity of the each pixel using the compensation factor to enhance intensity uniformity of the actual image.

In another aspect of the present invention, a computer readable medium carries one or more sequences of instructions for digital processing of an image captured by a sensor to enhance intensity uniformity of the image, wherein execution of the one or more sequences of instructions by one or more processors causes the one or more processors to perform the steps of: capturing an image of a white light source using an image sensor; calculating a compensation factor for each pixel of the image sensor using the image; storing the compensation factor in a memory; capturing an actual image using the image sensor; and processing a signal intensity of the each pixel using the compensation factor to enhance intensity uniformity of the actual image.

In yet another aspect of the present invention, a system for digital processing of an image captured by a sensor to enhance intensity uniformity of the image includes: means for capturing an image of a white light source using an image sensor; means for calculating a compensation factor for each pixel of the image sensor using the image; means for storing the compensation factor in a memory; means for capturing an actual image using the image sensor; and means for processing a signal intensity of the each pixel using the compensation factor to enhance intensity uniformity of the actual image.

In still another aspect of the present invention, a method for digital processing of an image captured by a sensor includes the steps of: capturing a plurality of images of a white light source using an image sensor; analyzing the plurality of images to create a set of compensation functions for a plurality of the pixels of the image sensor; storing the set of compensation functions in a memory; capturing an actual image using the image sensor; generating a compensation factor for each of the plurality of the pixels using the set of compensation functions; and processing a signal intensity of the each of the plurality of pixels using the compensation factor to enhance intensity uniformity of the actual image.

In another aspect of the present invention, a computer readable medium carries one or more sequences of instructions for digital processing of an image captured by a sensor, wherein execution of the one or more sequences of instructions by one or more processors causes the one or more processors to perform the steps of: capturing a plurality of images of a white light source using an image sensor; analyzing the plurality of images to create a set of compensation functions for a plurality of the pixels of the image sensor; storing the set of compensation functions in a memory; capturing an actual image using the image sensor; generating a compensation factor for each of the plurality of the pixels using the set of compensation functions; and processing a signal intensity of the each of the plurality of pixels using the compensation factor to enhance intensity uniformity of the actual image.

In another aspect of the present invention, a system for digital processing of an image captured by a sensor to enhance intensity uniformity of the image includes: means for capturing a plurality of images of a white light source using an image sensor; means for analyzing the plurality of images to create a set of compensation functions for a plurality of the pixels of the image sensor; means for storing the set of compensation functions in a memory; means for capturing an actual image using the image sensor; means for generating a compensation factor for each of the plurality of the pixels using the set of compensation functions; and means for processing a signal intensity of the each of the plurality of pixels using the compensation factor to enhance intensity uniformity of the actual image.

These and other features, aspects and advantages of the present invention will become better understood with reference to the following drawings, description and claims.

DETAILED DESCRIPTION

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

It must be noted that, as used herein and in the appended claims, the singular forms "a", "an", and "the" include plural referents unless the context clearly dictates otherwise. Thus, for example, reference to "a microlens" includes a plurality of such microlens, i.e., microlens array, and equivalents thereof known to those skilled in the art, and so forth.

One common practice of CMOS sensor customization is shifting a microlens array of the sensor to match incident rays at large angles. However, in the application of the shifting technique, the non-symmetric nature of the CMOS sensor layout may create non-symmetric brightness distribution over the image output, where the non-symmetric nature may be more pronounced at the corners and edges of the image output. In addition, such non-symmetric brightness may be accompanied by improper color balance, i.e., the color of the image of a white light source is not white over the entire image output. The present inventor provides a simple, yet effective way to resolve the appearance of non-symmetric brightness in the image by introducing off-center alignment between a microlens array and a sensor pixel array of the CMOS sensor.

Figure 1:
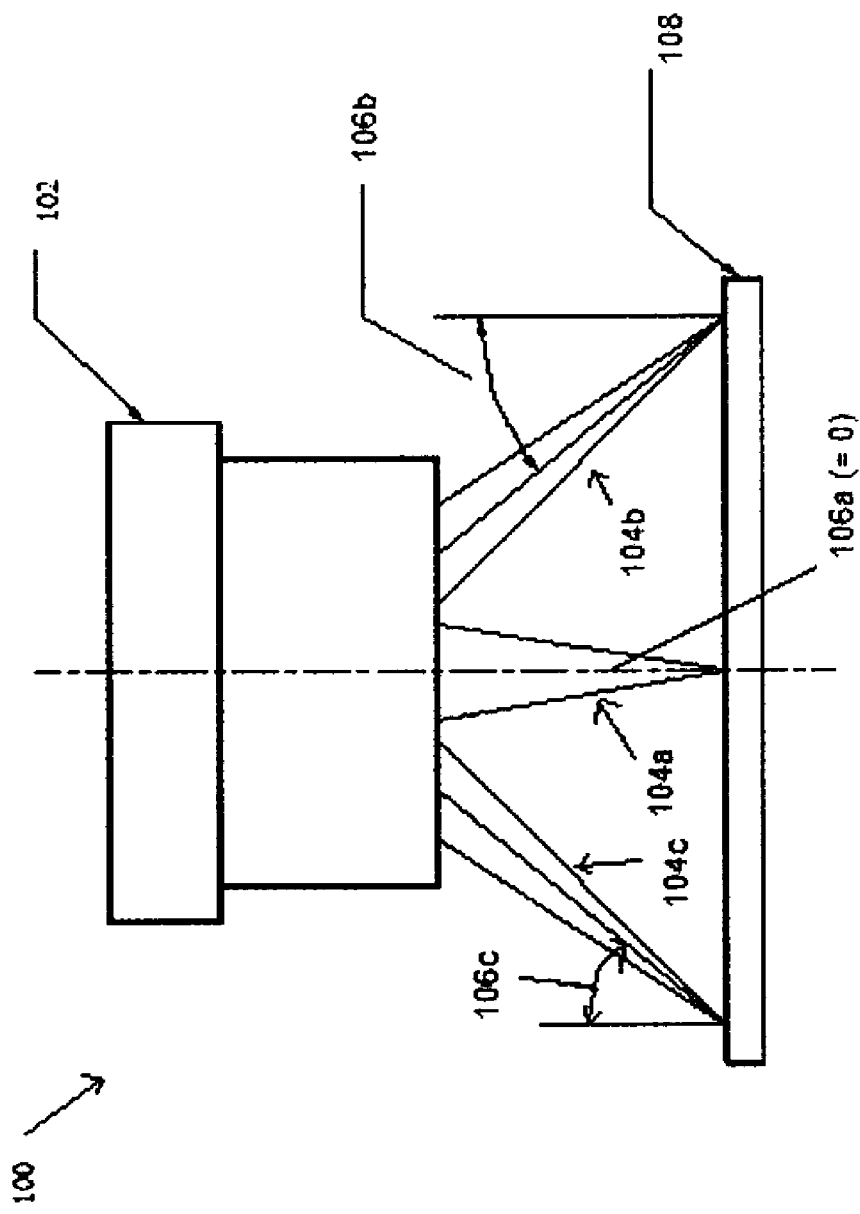
FIG. 1 is a schematic diagram of an image module assembly in accordance with one embodiment of the present teachings.

FIG. 1 is a schematic diagram of an image module assembly 100 (or, equivalently a lens/sensor assembly) in accordance with one embodiment of the present teachings. The lens/sensor assembly 100 may be included in digital image devices, such as digital image camera and cellular phone with imaging capabilities. As illustrated, the lens/sensor assembly 100 includes: a sensor die 108 as an image sensor; and a lens assembly 102 having several pieces of lenses and iris (no shown in FIG. 1 for simplicity) assembled in a lens barrel, the lens assembly forming an image on the surface of the sensor die 108. In one embodiment, the width and length of the sensor die 108 is about, but not limited to, 5 mm.

Optical rays 104a-c, exemplary optical rays from the lens assembly 102, are directed to sensor pixels (the sensor pixels will be explained later) at the center, near the left edge and near the right edge of the sensor die 108, respectively, and angled with respect to the surface normal of the sensor die 108 by chief ray angles 106a-c, respectively. The chief ray angles 106b and 106c may be as large as 30 degrees, while the chief ray angle 106a is about zero degree.

Figure 2C:
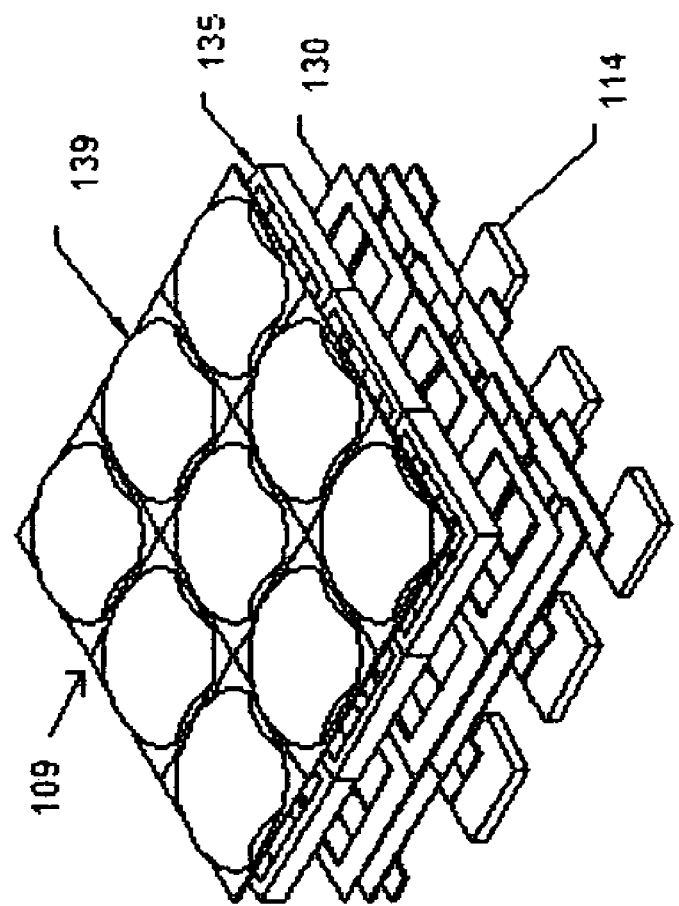
FIGS. 2B, 2C and 2D are a front, perspective and side view of the portion in FIG. 2A, respectively
Figure 2A:
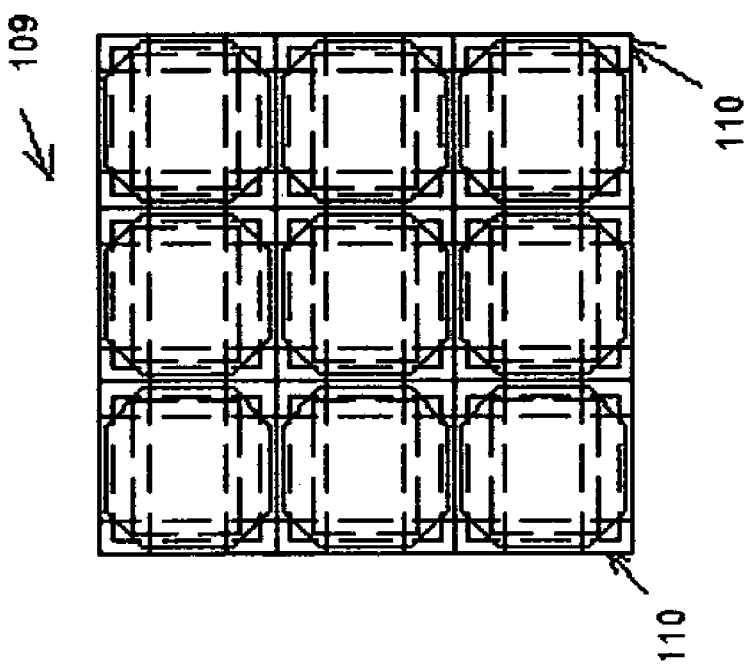
FIG. 2A is a top view of a portion of a silicon die in accordance with one embodiment of the present teachings.
Figure 2B:
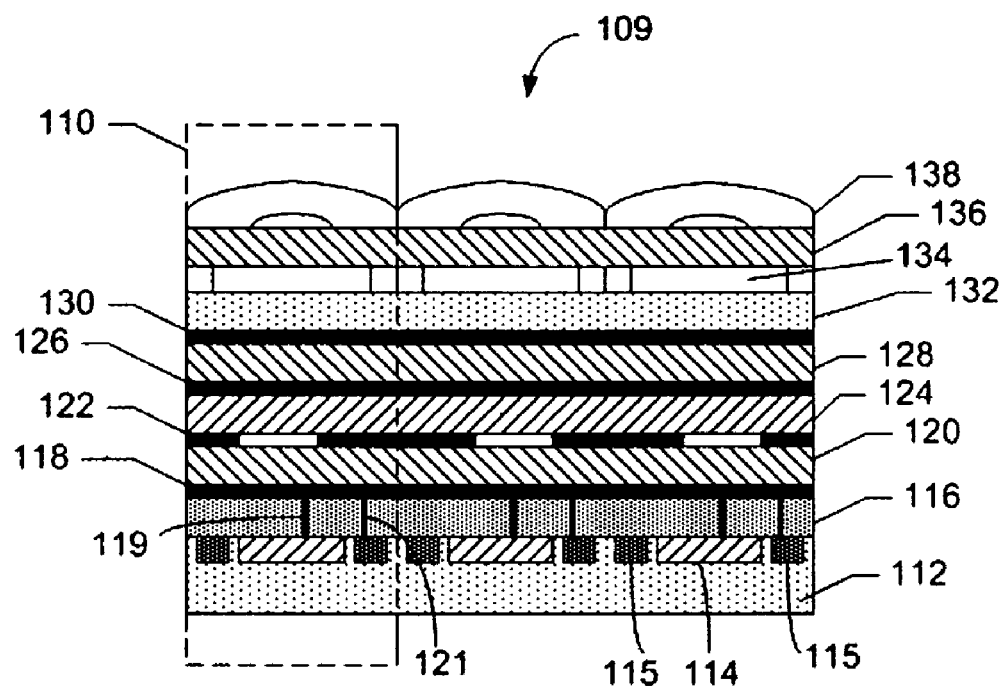
Figure 2D:
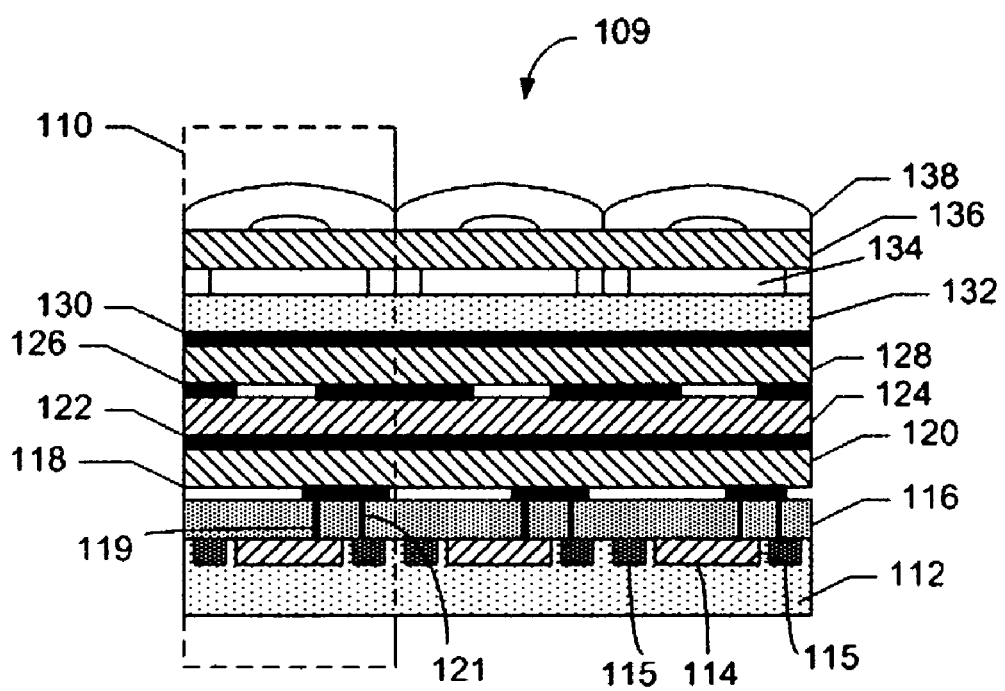

The sensor die 108, a type of CMOS image sensor, is a piece of silicon that includes an integrated circuit (IC) to function as an image sensor. The IC comprises a processing area and a sensing area that may have from several hundred thousands to millions of identical sensor pixels. FIG. 2A is a top view of a portion 109 of the silicon die 108 in accordance with one embodiment of the present teachings, where only 9 sensor pixels 110 are shown for simplicity. FIGS. 2B and 2D are the front and side views of the portion 109 in FIG. 2A, respectively, showing multiple layers 112-138 of the silicon die 108. FIG. 2C is a perspective view of the portion 109 in FIG. 2A, focusing on several key features of the layers.

As shown in FIGS. 2B-D, each pixel 110 includes: a silicon substrate layer 112; a photodiode 114 forming a portion of and being underneath the surface of the silicon substrate layer 112; a plurality of passive components 115 (such as transistors, resistors and capacitors) underneath the surface of the silicon substrate layer 112; four transparent insulating layers 116, 120, 124 and 128; four metal layers 118, 122, 126 and 130, the four metal layers being insulated by the four transparent insulating layers 116, 120, 124 and 128, and connected to the photodiode 114 and/or the plurality of passive elements 115; a first planar layer 132, the first planar layer being a transparent insulating layer and having a flat top surface; a color filter 134 for passing a specific wavelength or wavelength band of light to the photodiode 114; and a microlens 138 for focusing light rays to the photodiode 114. A microlens array 139 in FIG. 2C comprises the identical microlens 138.

In one embodiment of the present teachings, the photodiode 114 and the plurality of passive elements 115 may be formed by a semiconductor etching process, i.e., etching the surface of the silicon substrate layer 112 and chemically depositing intended types of material on the etched area to form the photodiode 114 and the plurality of passive elements 115.

As mentioned, the color filter 134 filters light rays (such as 104 in FIG. 1) directed to its corresponding photodiode 114 and transmits light rays of only one wavelength or wavelength band. In one embodiment of the present teachings, a RGB color system may be used, and consequently, a color filter array (CFA) 135 (shown in FIG. 2C) comprises three types of filters 134. In the RGB system, signals from three pixels are needed to form one complete color. However, it is noted that the number of types of filters in the CFA 135 can vary depending on the color system applied to the silicon die 108.

The metal layers 118, 122, 126 and 130 function as connecting means for the photodiodes 114 and passive components 115 to the processing area of the silicon die 108, where the signals from the photodiodes and passive components are transmitted using a column transfer method. In FIGS. 2C and 2D, for the purpose of illustration, exemplary connections 119 and 121 are shown, where the connections 119 and 121 link the 118 to the photodiode 114 and one of the passive components 115, respectively. However, it should be apparent to the one of ordinary skill that connections between the four metal layers (118, 122, 126 and 130) and the photodiode 114 and the passive components 115 can vary depending on the overall layout of the silicon die 108. Also, the number of metal layers depends on the complexity of the layout of metal layers and, as a consequence, a different layout of the silicon die may have different number of metal layers.

Figure 3B:
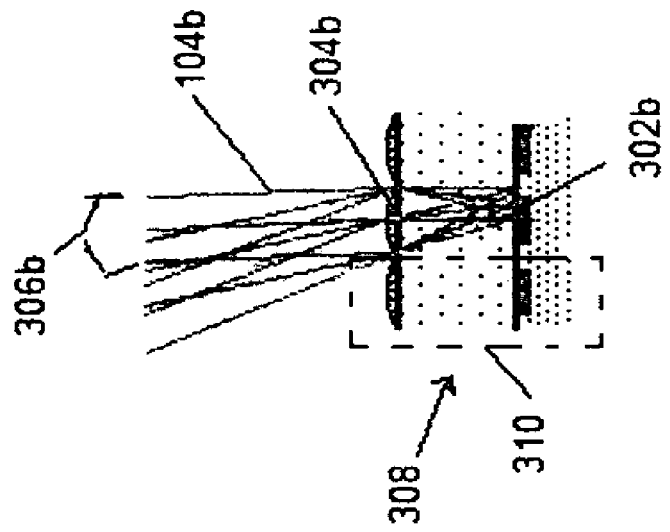
FIGS. 3A and 3B illustrate ray acceptance angles for a sensor with a non-shifted microlens array.
Figure 3A:
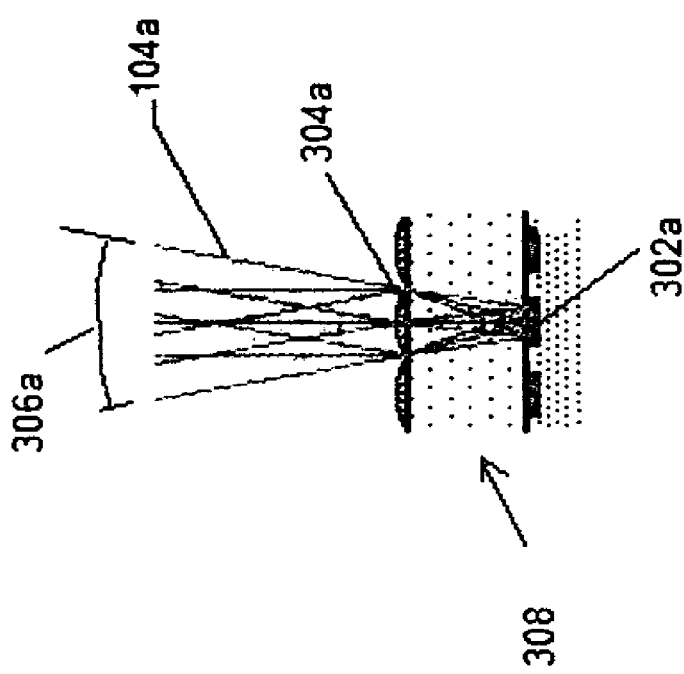
Figure 4:
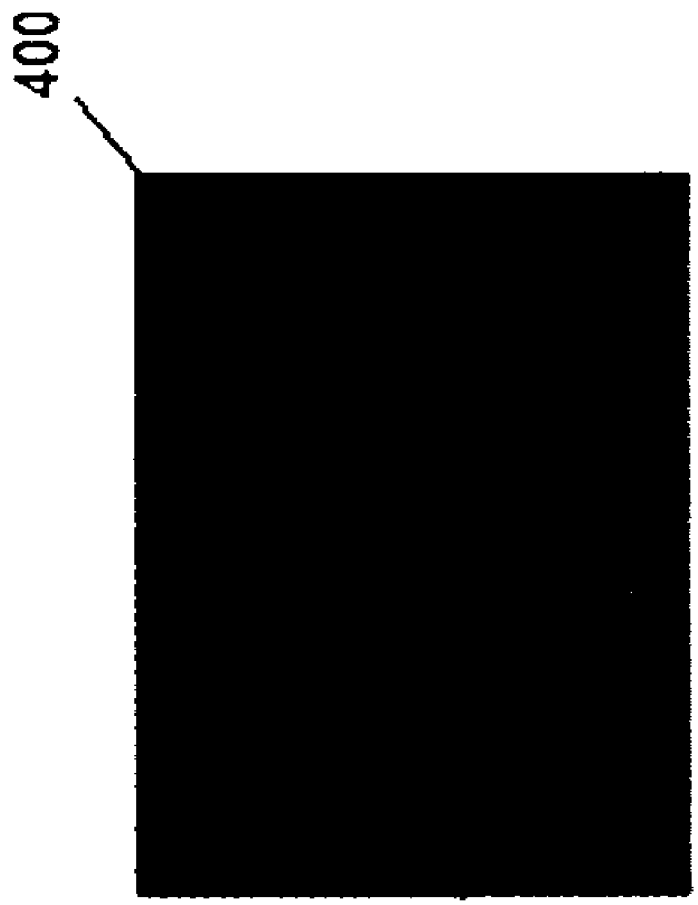
FIG. 4 is an image of a white light source captured by an image sensor having a sensor die, where the brightness of the image is non-uniform across the sensor die.

As illustrated in FIG. 1, each of the optical rays 104a-c is angled with respect to the surface normal of the sensor die 108. FIGS. 3A and 3B illustrate ray acceptance angles 306 for a sensor die 308 with a non-shifted microlens array 304, where the optical axis of a microlens in each pixel 310 coincides with the optical axis of a photodiode 302 in the pixel. (Hereinafter, the optical axis of a photodiode refers to an axis normal to the surface of the photodiode and passes through the geometric center of the photodiode.) In FIGS. 3A-B, for simplicity, only photodiodes 302 and a microlens array 304 are shown. As illustrated in FIG. 3A, most of the light rays 104a are collected by a photodiode 302a that is located at the center of the sensor die 308. Thus, the light ray acceptance angle 306a is same as that of incoming light rays 104a. In contrast, as shown in FIG. 3B, some portion of the optical rays 104b are not collected by a photodiode 302b that is located near the right edge of the silicon die 308, i.e., the photodiode 302b has a limited ray acceptance angle 306b. Such limited ray acceptance angle may result non-uniform brightness distribution of an image on the sensor die 308, as shown in FIG. 4. FIG. 4 shows an image 400 of a white light source captured by an image sensor having the sensor die 308, where the brightness of image 400 is non-uniform across the sensor die 308. In addition, the image 400 may not be a color balanced, i.e., the color of the image is not white over the entire sensor die.

Figure 5B:
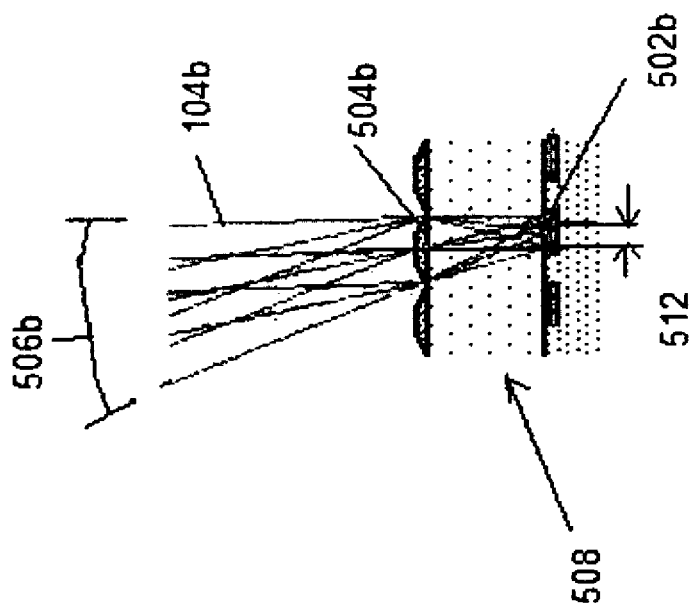
FIGS. 5A and 5B illustrate ray acceptance angles for a sensor with a shifted microlens array in accordance with one embodiment of the present teachings.
Figure 5A:
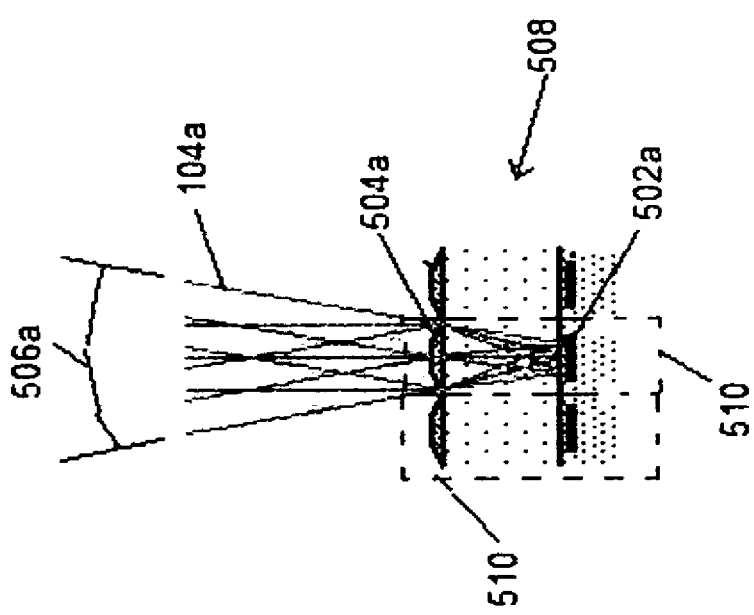

FIGS. 5A and 5B illustrate ray acceptance angles 506 for a sensor die 508, where the optical axis of a microlens 504 in each pixel 510 has been shifted with respect to the optical axis of a photodiode 502 of the pixel in accordance with one embodiment of the present teachings. In FIG. 5A, the optical axis of a microlens 504a in a pixel coincides with the optical axis of a photodiode 502a of the same pixel, where the pixel is located at the center of the sensor die 508. However, as shown in FIG. 5B, the optical axis of a microlens 504b in a pixel located near the right edge of the sensor die 508 has been shifted by a distance 512 with respect to the optical axis of a photodiode 502b in an effort to improve the ray acceptance angle 506b. The light ray acceptance angles 506a and 506b are equal to those of the incoming light rays 104a and 104b, respectively.

Figure 6:
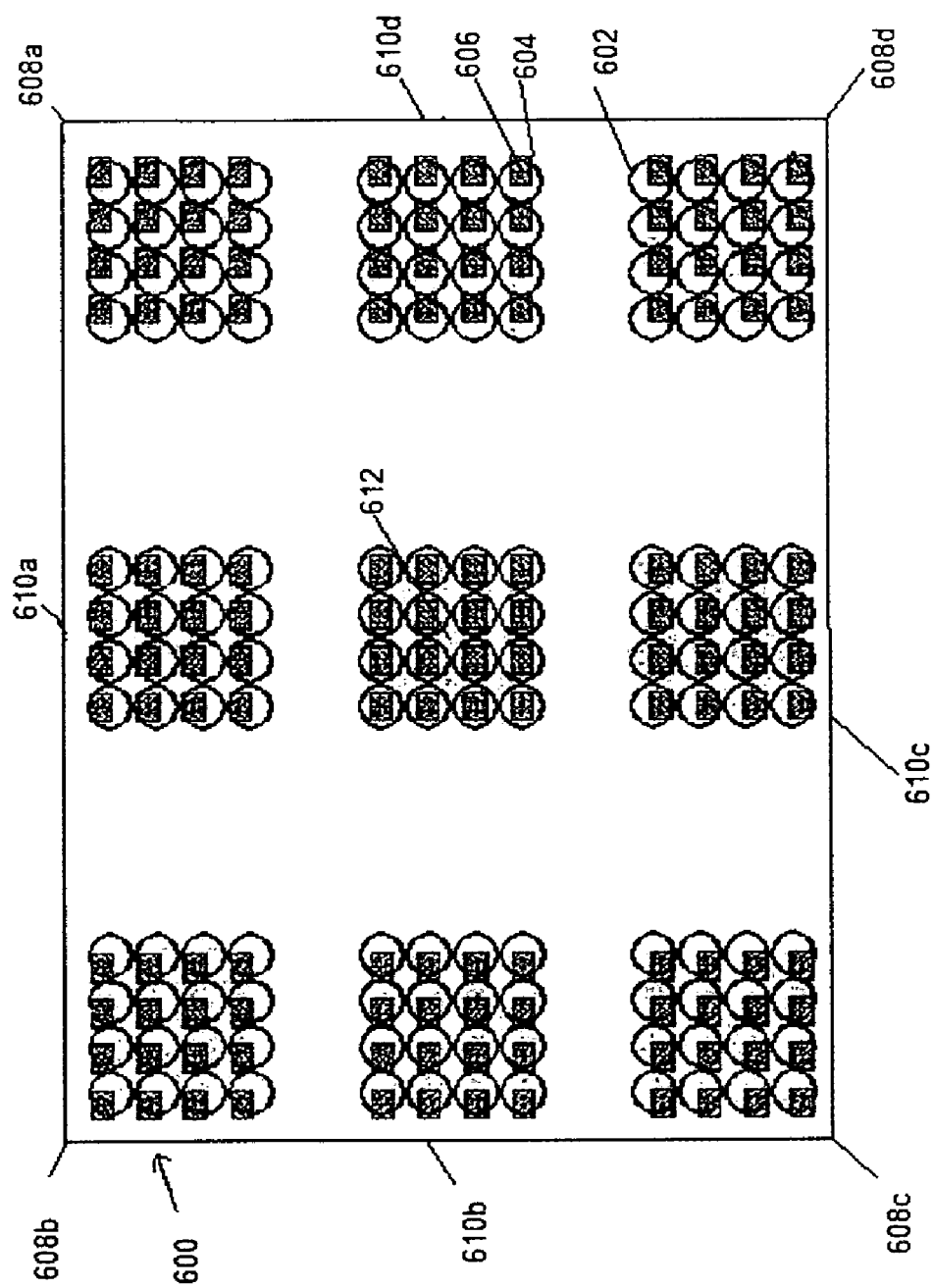
FIG. 6 is a top view of a sensor die with a microlens array, elements of which are shifted to achieve ray angle match over the entire sensor die in accordance with one embodiment of the present teachings.

FIG. 6 is a top view of a sensor die 600 with a microlens array 602, the elements of which are shifted to achieve ray angle match over the entire sensor die 600 in accordance with one embodiment of the present teachings. (In FIG. 6, for simplicity, only the array of microlens 602 and photodiodes 604 are shown.) As shown in FIG. 6, each microlens 602 has been shifted toward the center 612 of the sensor die 600 so that each of light spots 606 is located within the corresponding photodiode 604, which improves the ray acceptance angle, and subsequently, the brightness distribution of image on the silicon die 600. The shifting of each microlens is more pronounced near sensor edges 610 and corners 608 than the center 612. As mentioned above, the shifting of each microlens is implemented by scaling a photo mask of the microlens array 602. Detailed description of shifting each microlens is disclosed in US patent application, entitled "Microlen alignment procedures in CMOS image sensor design," which is hereby incorporated herein by reference in its entirety.

Figure 7A:
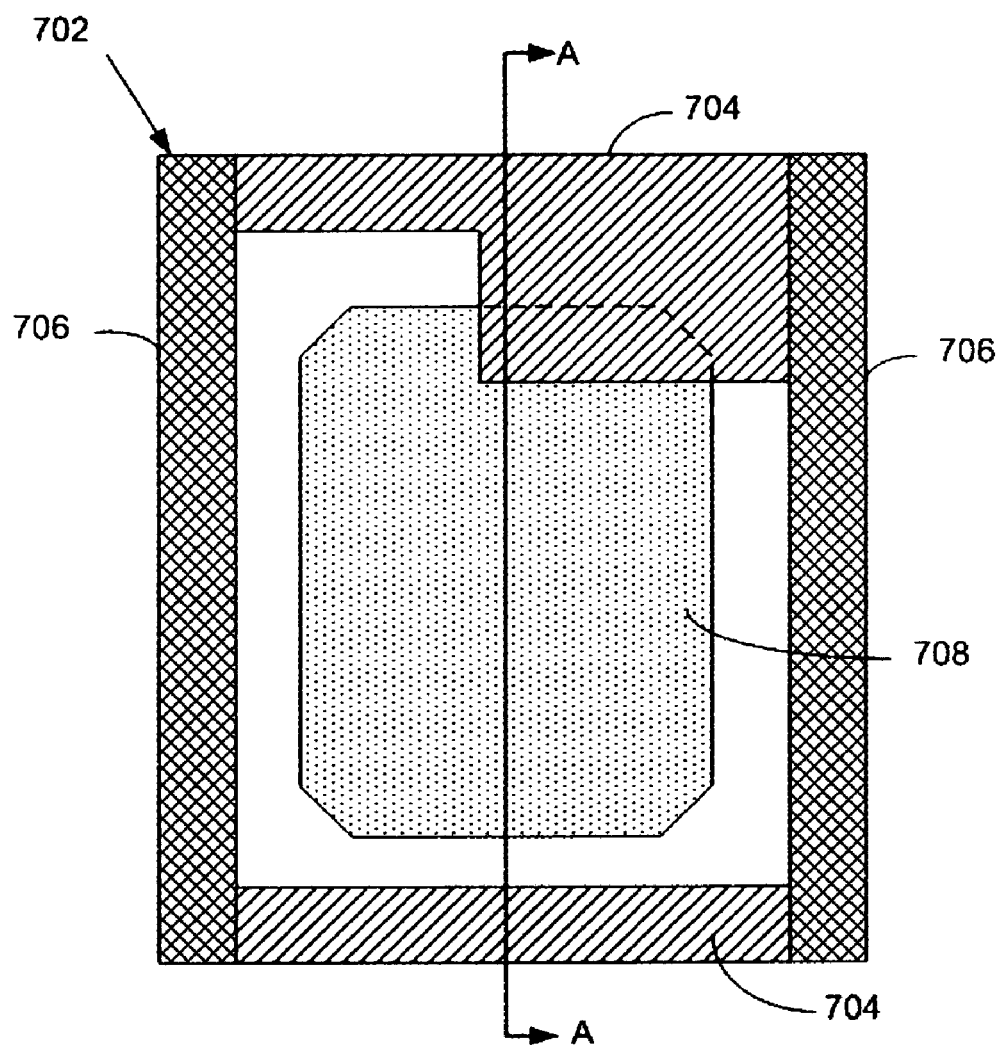
FIG. 7A is a top view of a typical pixel, where a metal layer is blocking a corner of the photodiode of each pixel.

The array shifting technique improves the non-uniformity of image intensity distribution. However, this technique, if combined with improper metal layer layout, can yield another source of non-uniformity. FIG. 7A shows a top view of a typical pixel 702, illustrating a detailed layout of metal layers 704, 706 and photodiode 708. Therein, for simplicity, only two metal layers and photodiode are shown. Metal layers 704 and 706 may be formed of an opaque material, such as aluminum, and define the shape of openings 710 through which the light rays directed to photodiode 708 are collected. As shown in FIG. 7A, the shape of the opening 710 may not be axially symmetric with respect to the axis that is surface normal and passes through the geometric center of photodiode 708.

Figure 7E:
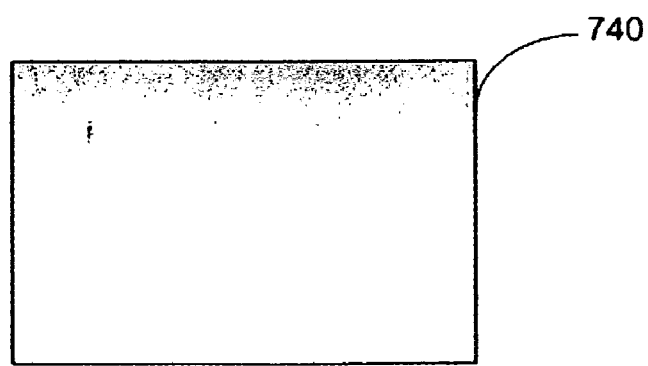
FIG. 7E is an image of a white light source captured by an image sensor having pixels with metal layer as shown in FIG. 7A.
Figure 7B:
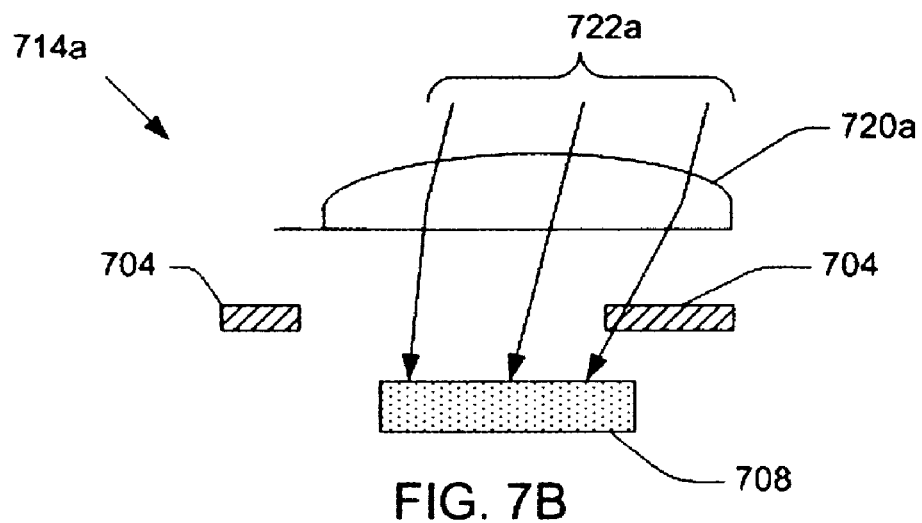
FIGS. 7B-D show cross sectional views of three pixels located at edges of a sensor die, illustrating the interference of light rays with a metal layer shown in FIG. 7A.
Figure 7C:
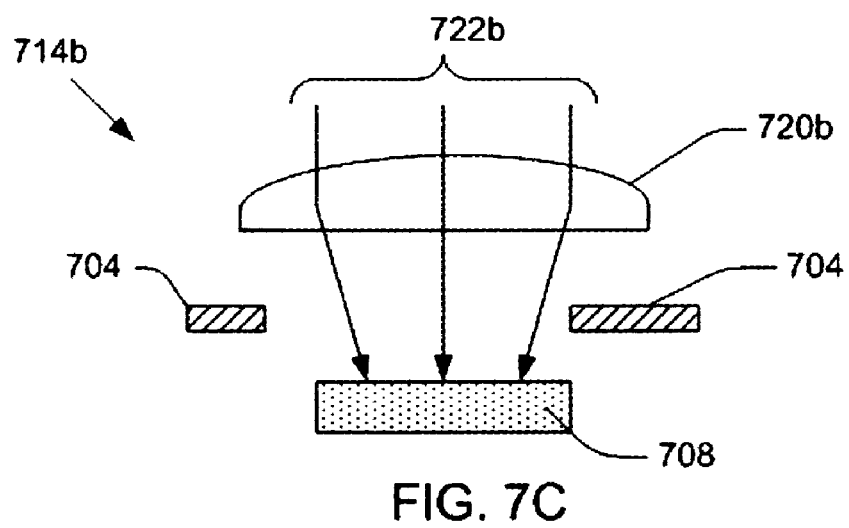
Figure 7D:
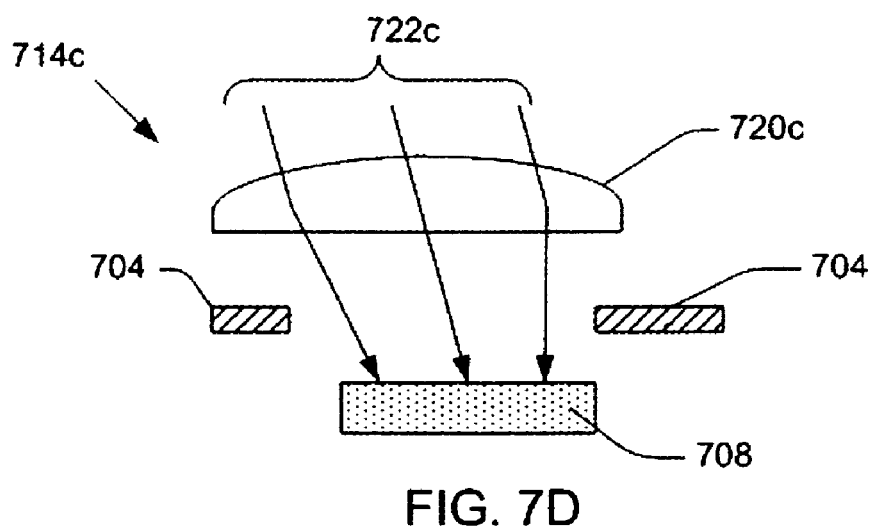

FIGS. 7B-D show cross sectional views of three pixels 714a-c located at 610a, 612, and 610c (FIG. 6), respectively, along line A-A of FIG. 7A, illustrating the interference of metal layer 704 with light rays 722a-c. As shown in FIGS. 7B-D, microlenses 720a-c have been shifted with respect to photodiode 708 to optimize the ray acceptance angle. The blockage of light by metal layer 704 is the most significant at pixel 714a and becomes less pronounced as it moves toward the pixel 714c, which results non-uniform intensity distribution of image 740 shown in FIG. 7E.

Figure 8A:
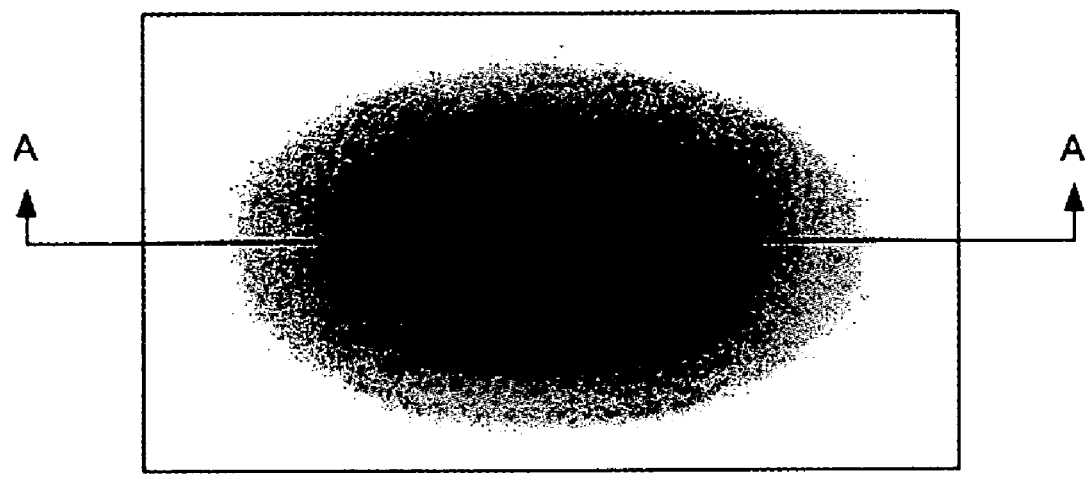
FIG. 8A is an image of a white light source captured by a typical image sensor, where the intensity is largest at the center pixel and decreases as it approaches the edges.
Figure 8B:
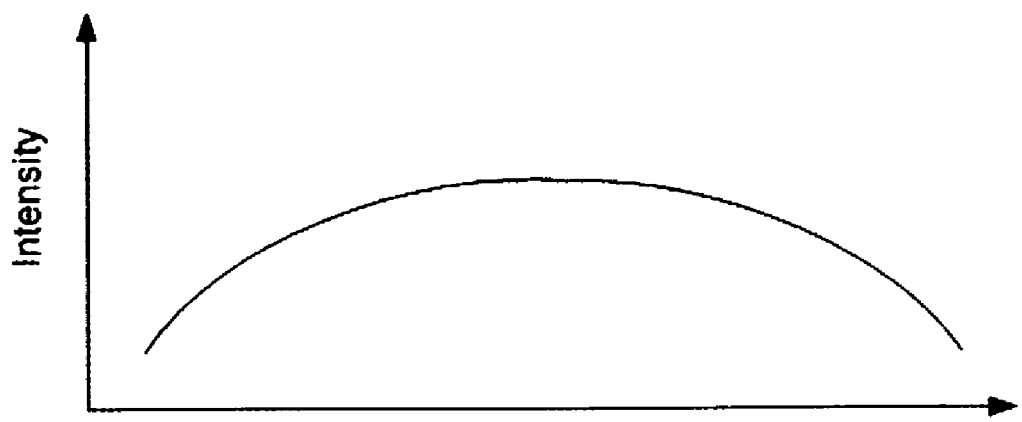
FIG. 8B shows intensity distribution of FIG. 8A along a line A-A.

Another typical non-uniformity is shown in FIG. 8A. FIG. 8A is an image of a white light source, where the intensity is largest at the center pixel and decreases as it approaches the edges. The intensity along line A-A is plotted in FIG. 8B. The signal intensity of each pixel is approximately proportional to $\cos^4 \theta$, where $\theta$ is the chief ray angles 106 (shown in FIG. 1). To improve such non-uniformity of image, which is rooted in the interference of a metal layer with optical light rays, a digital imaging process can be performed using a set of compensation factors for entire pixels each.

Figure 9:
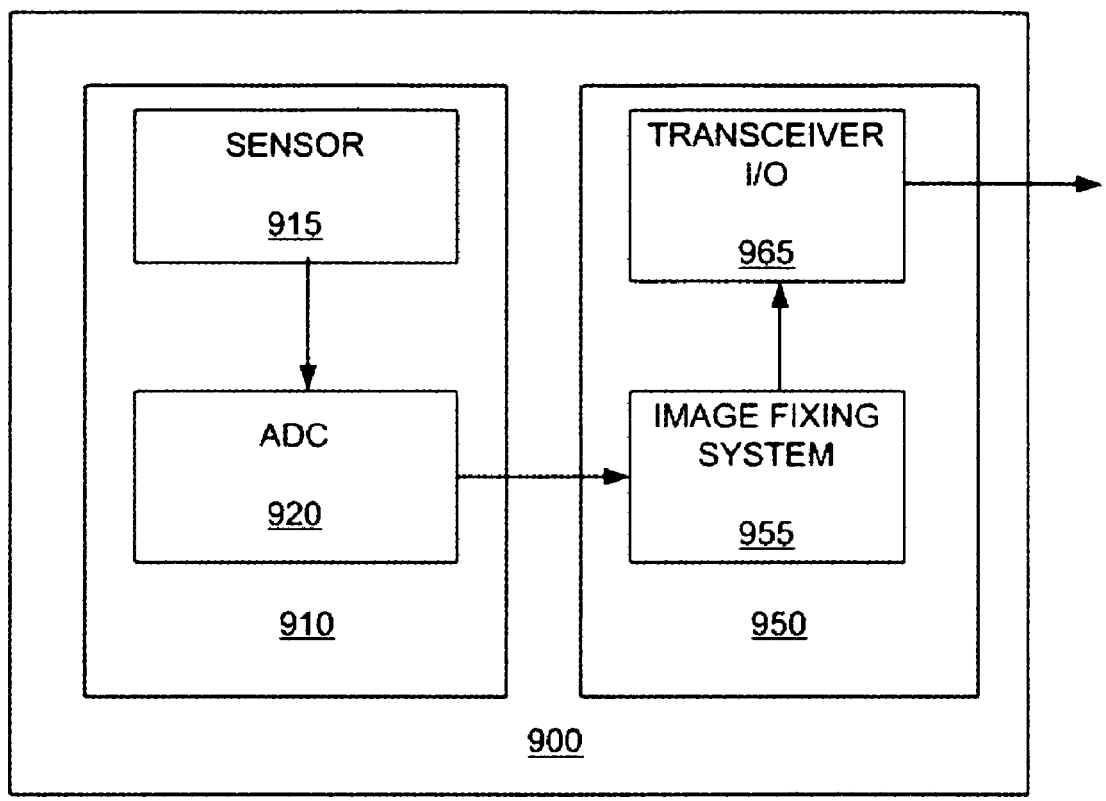
FIG. 9 shows an image sensor chip having a system for compensating pixel values to enhance image uniformity in accordance with one embodiment of the present teachings.

Referring now to FIG. 9, FIG. 9 shows an image sensor chip 900 having a system for compensating pixel values to enhance image uniformity in accordance with one embodiment of the present teachings. As mentioned, the image sensor chip 900 includes an image sensor unit 910 and an image processing unit 950. The image sensor unit 910 is adapted for capturing an image and digitizing the captured image to be processed by the image processing unit 950. The image sensor unit 910 includes: an image sensor 915 having a plurality of pixel elements for capturing an optical image, each pixel element converting an optical signal to an analog signal; and an analog-to-digital converter (ADC) 920 for converting the analog signal into a digital signal. The image processing unit 950 includes: an image fixing system 955 for fixing pixel value defects received from the ADC 920; and a transceiver 965 for receiving the image data from the image fixing system 955 and transmitting the image out of the sensor chip 900.

Figure 10:
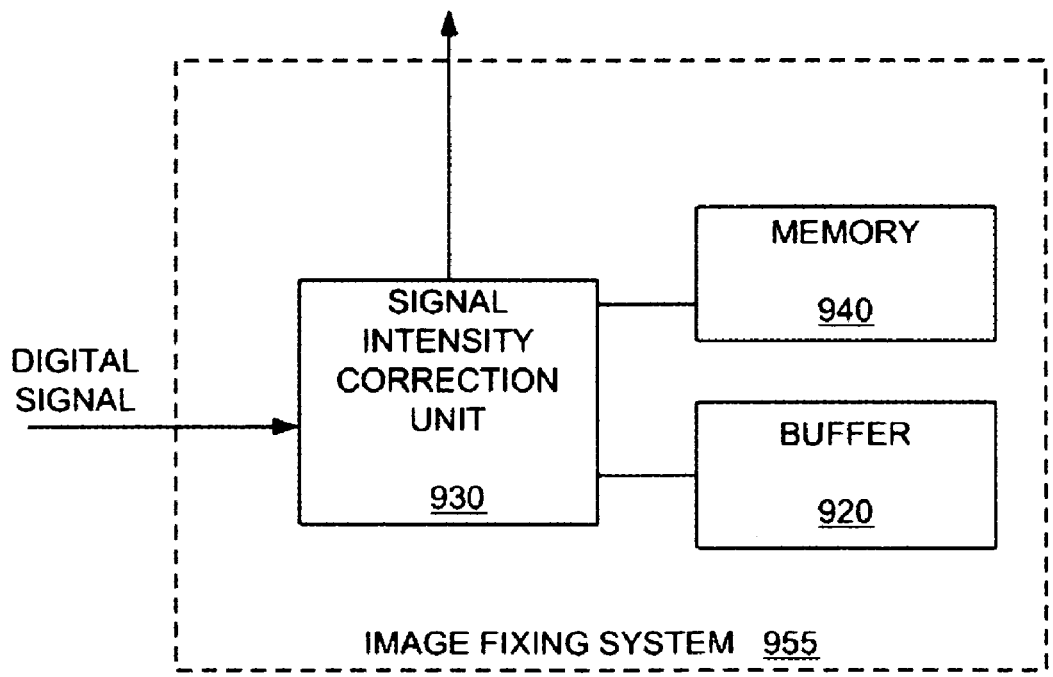
FIG. 10 shows a signal intensity correction units included in the image fixing system of FIG. 9.

Referring now to FIG. 10 in view of FIG. 9, FIG. 10 shows units included in the image fixing system 955 of FIG. 9 for compensating pixel values. These units include a signal intensity correction unit 930, a buffer 920 for storing pixel values to be processed and a memory 940. The signal intensity correction unit 930 receives digital pixel data from the ADC 920 and stores into the buffer. Then, using compensation factors stored in the memory 940, the signal intensity correction unit 930 performs compensating the digital pixel data to enhance the uniformity of image captured by the sensor 915.

As illustrated in FIGS. 7E and 8A, the intensity of the captured image of a white light source may have a unique distribution. The compensation factors stored in the memory 940 are determined using such an image, where the compensation factor of a pixel is a ratio of the intensity of central pixel to that of the pixel. When the signal intensity correction unit 930 receives a new image from the ADC 920, it stores the image data in the buffer. Then, the signal intensity correction unit 930 multiplies the intensity of each pixel in the buffer by a corresponding compensation factor stored in the memory 940, which enhances the uniformity of the captured image.

Figure 11:
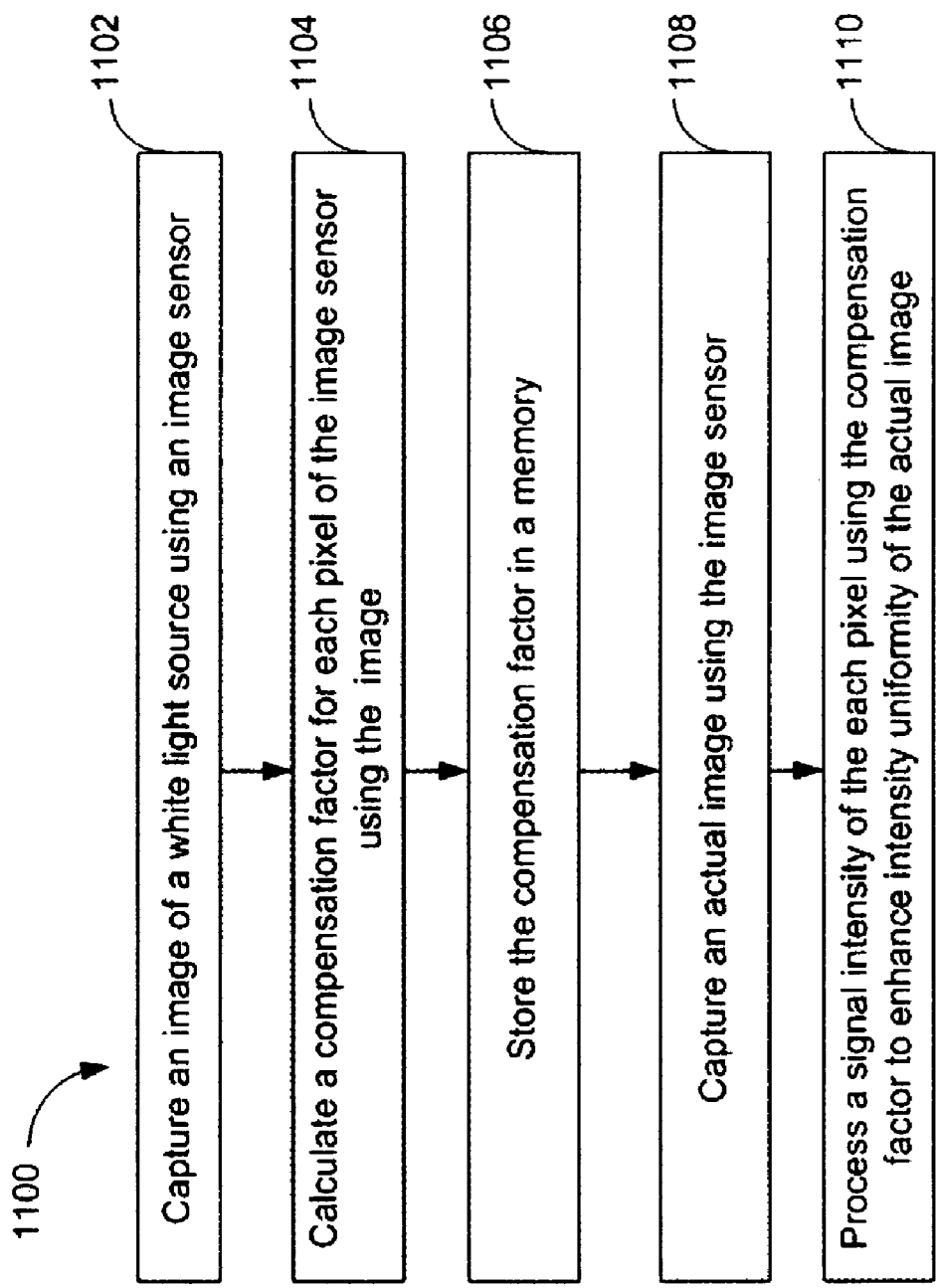
FIG. 11 shows a flow chart illustrating exemplary steps for digital processing of an image to enhance the uniformity of the image in accordance with one embodiment of the present teachings.

FIG. 11 shows a flow chart 1100, illustrating exemplary steps for digital processing of an image to enhance the uniformity of the image in accordance with one embodiment of the present teachings. At step 1102, an image of a white light source is captured by an image sensor. Next, a compensation factor for each pixel is calculated using the captured image at step 1104. Subsequently, at step 1106, the calculated compensation factor is stored in a memory. At step 1108, an actual image to be processed is captured by the image sensor. Then, the intensity of each pixel for the actual image is processed using the stored compensation factor.

Figure 12:
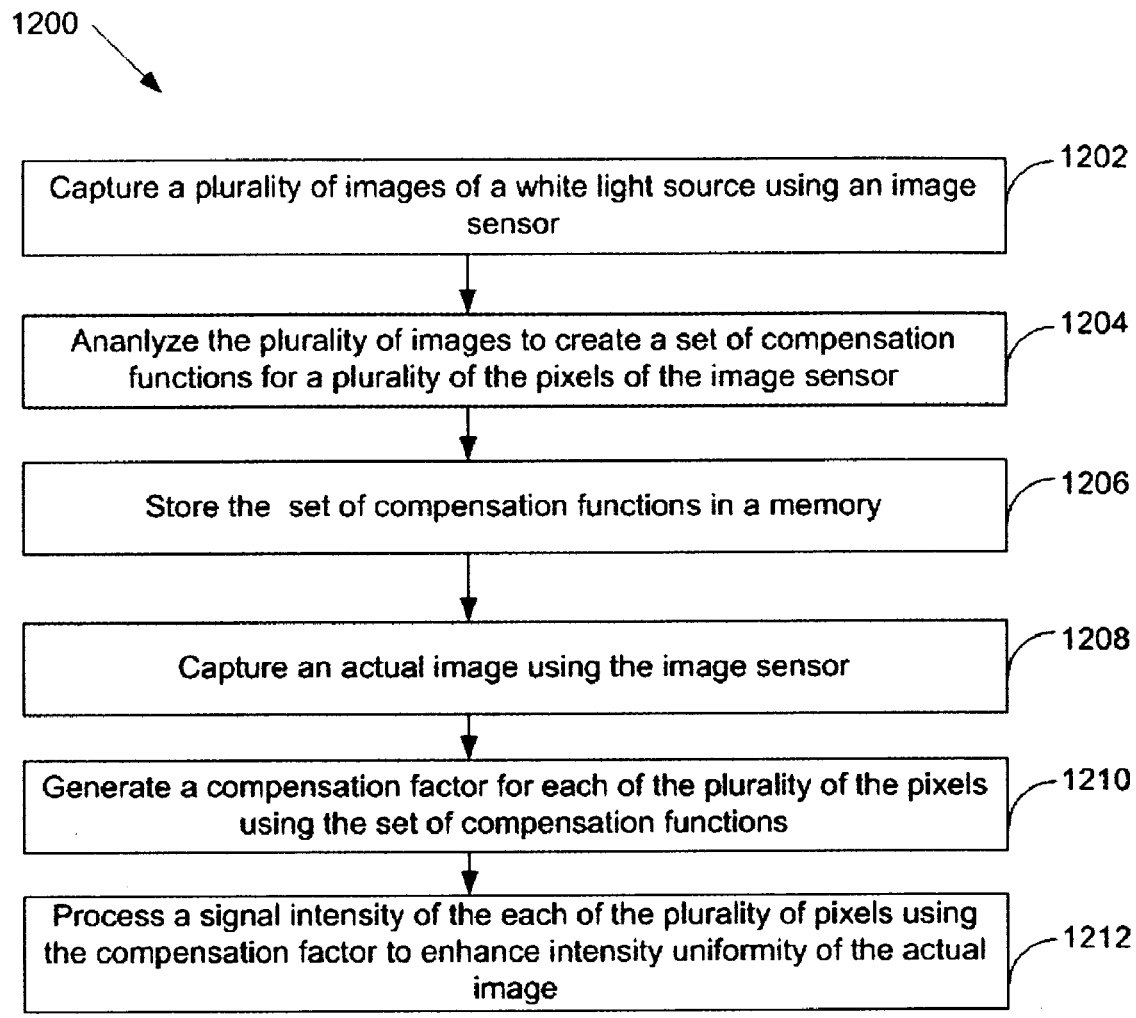
FIG. 12 shows a flow chart illustrating exemplary steps for digital processing of an image to enhance the uniformity of the image in accordance with another embodiment of the present teachings.

In one embodiment, instead of storing the compensation factor for each pixel in a memory, the compensation factor may be generated on a real time basis using stored compensation functions, where the stored compensation functions may have been created by analyzing the images of one or more white light source. FIG. 12 shows a flow chart 1200 illustrating exemplary steps for digital processing of an image to enhance the uniformity of the image in accordance with another embodiment of the present teachings. At step 1202, the images of a white light source may be captured by an image sensor. Next, a set of compensation functions for the pixels of the image sensor may be created by analyzing the captured images at step 1204. Subsequently, at step 1206, the calculated set of compensation functions may be stored in a memory. At step 1208, an actual image may be captured by the image sensor. Then, at step 1210, a compensation factor for each pixel may be calculated using the stored set of compensation functions. In one embodiment, the step 1210 may be performed on a real time basis. At step 1212, the signal intensity of each pixel may be processed using the calculated compensation factor, wherein the process may correspond to the multiplication of the compensation factor to the signal intensity.

Those skilled in the art will appreciate that the methods and designs described above have additional applications and that the relevant applications are not limited to those specifically recited above. It should be understood that the foregoing relates to exemplary embodiments of the invention and that modifications may be made without departing from the spirit and scope of the invention as set forth in the following claims.

What is claimed is:

1. A method for digital processing of an image captured by an image sensor to enhance intensity uniformity of the images, the image sensor including a plurality of pixels arranged as an array, the method comprising:
   capturing a reference image of a white light source using the image sensor;
   calculating a compensation factor for each of the plurality of pixels of the image sensor using the reference image, the compensation factor of a particular one of the plurality of pixels corresponding to a relationship between a reference signal intensity of a reference pixel located at a central location of the array and a measured signal intensity of the particular one of the plurality of pixels;
   storing the compensation factor in a memory;
   capturing an actual image using the image sensor; and
   processing the captured actual image using the compensation factor to enhance intensity uniformity of the captured actual image.

2. The method of claim 1, wherein the compensation factor is a ratio of the reference signal intensity to the measured signal intensity.

3. The method of claim 1, wherein the step of processing the captured actual image includes:
   multiplying the compensation factor to the measured signal intensity of the particular one of the plurality of pixels.

4. A computer readable medium carrying one or more sequences of instructions for digital processing of an image captured by an image sensor having a plurality of pixels arranged as an array to enhance intensity uniformity of the image, wherein execution of the one or more sequences of instructions by one or more processors causes the one or more processors to perform the steps of:
   capturing a reference image of a white light source using the image sensor;
   calculating a compensation factor for each of the plurality of pixels of the image sensor using the reference image, the compensation factor of a particular one of the plurality of pixels corresponding to a relationship between a reference signal intensity of a reference pixel located at a central location of the array and a measured signal intensity of the particular one of the plurality of pixels;
   storing the compensation factor in a memory;
   capturing an actual image using the image sensor; and
   processing the captured actual image using the compensation factor to enhance intensity uniformity of the captured actual image.

5. The method of claim 4, wherein the compensation factor is a ratio of the reference signal intensity to the measured signal intensity.

6. A method for digital processing of an image captured by an image sensor having a plurality of pixels arranged as an array, the method comprising:
   capturing a plurality of images of a white light source using the image sensor;
   analyzing the plurality of images to create a set of compensation function for the plurality of the pixels of the image sensor, the set of compensation functions defining a relationship between a measured signal intensity of a particular one of the plurality of pixels and a reference signal intensity of a reference pixel located at a central location of the array;

storing the set of compensation functions in a memory;

capturing an actual image using the image sensor;

generating a plurality of compensation factors each of which being for an associated one of the plurality of the pixels using the set of compensation functions; and processing the captured actual image using the plurality of compensation factors to enhance intensity uniformity of the captured actual image.

7. The method of claim 6, wherein the step of generating the plurality of compensation factor is performed on a real time basis.

8. The method of claim 6, wherein the compensation factor is a ratio of the reference signal intensity to the measured signal intensity.

9. A computer readable medium carrying one or more sequences of instruction for digital processing of an image captured by an image sensor having a plurality of pixels arranged as an array, wherein execution of the one or more sequences of instructions by one or more processors causes the one or more processors to perform the step of:

capturing a plurality of images of a white light source using the image sensor;

analyzing the plurality of images to create a set of compensation function for the plurality of the pixels of the image sensor, the set of compensation functions defining a relationship between a measured signal intensity of a particular one of the plurality of pixels and a reference signal intensity of a reference pixel located at a central location of the array;

storing the set of compensation functions in a memory;

capturing an actual image using the image sensor;

generating a plurality of compensation factors each of which being for an associated one of the plurality of the pixels using the set of compensation functions; and processing the captured actual image using the plurality of compensation factors to enhance intensity uniformity of the captured actual image.

10. The method of claim 9, wherein the compensation factor is a ratio of the reference signal intensity to the measured signal intensity.

11. An image sensor device, comprising:

an array of a plurality of pixel elements each disposed at an assigned location within the array;

a memory; and a signal intensity correction unit communicatively connected to the memory, the signal intensity correction unit having an input configured to receive an image captured by the array, the signal intensity correction unit further having an output, the signal intensity correction unit being configured to receive through the input a reference image of a white light source captured by the array, to calculate a compensation factor for each of the plurality of pixels using the received reference image, the compensation factor of a particular one of the plurality of pixels corresponding to a relationship between a reference signal intensity of a reference pixel located in a central location of the array and a measured signal intensity of the particular one of the plurality of pixels, and to store the calculated compensation factors in the memory, the signal intensity correction unit being further configured to receive through the input an actual image captured by the array, and to output a compensated image through the output, the compensated image being produced by an application of the compensation factors stored in the memory to the received actual image.

12. The method of claim 11, wherein the compensation factor is a ratio of the reference signal intensity to the measured signal intensity.

13. The image sensor device of claim 11, further comprising:

an analog-to-digital converter configured to receive from the array of the plurality of pixels an analog signal representing the image captured by the array, and to convert the analog signal into a digital signal representing the image captured by the array to be provided to the input of the signal sensitivity correction unit.

14. The image sensor device of claim 11, further comprising:

a buffer memory in communication with the signal intensity correction unit, the signal intensity correction unit being configured to store the digital signal representing the actual image captured by the array in the buffer memory.

15. The image sensor device of claim 14, wherein the compensated image is produced by multiplying the compensation factors stored in the memory to the digital signal representing the actual image stored in the buffer memory.

16. An image sensor device, comprising:

an array of a plurality of pixel elements each disposed at an assigned location within the array;

a memory; and a signal intensity correction unit communicatively connected to the memory, the signal intensity correction unit having an input configured to receive an image captured by the array, the signal intensity correction unit further having an output, the signal intensity correction unit being configured to receive through the input a plurality of reference images of a white light source captured by the array, to analyze the plurality of reference images to create a set of compensation functions for the plurality of the pixels, and to store the set of compensation functions in the memory, the set of compensation functions defining a relationship between a measured signal intensity of a particular one of the plurality of pixels and a reference signal intensity of a reference pixel located at a central location of the array, and wherein the signal intensity correction unit being further configured to receive through the input an actual image captured by the image sensor, to generate a compensation factor for each of the plurality of the pixels using the set of compensation functions, and to output a compensated image through the output, the compensated image being produced by an application of the compensation factors to the received actual image.

17. The method of claim 16, wherein each of the compensation factors is a ratio of the reference signal intensity to the measured signal intensity.

* * * * *